United States Patent [19]

Wong et al.

[11] Patent Number: 5,156,820

[45] Date of Patent: Oct. 20, 1992

[54] REACTION CHAMBER WITH CONTROLLED RADIANT ENERGY HEATING AND DISTRIBUTED REACTANT FLOW

[75] Inventors: Fred Wong, Fremont; Yen-Hui Ku, Sunnyvale, both of Calif.

[73] Assignee: Rapro Technology, Inc., Fremont, Calif.

[21] Appl. No.: 351,829

[22] Filed: May 15, 1989

[51] Int. Cl.⁵ .......................... B01J 19/08; B01J 19/12
[52] U.S. Cl. .................. 422/186.05; 118/725; 118/730; 437/233; 437/243; 437/925; 437/963; 427/248.1
[58] Field of Search .............. 118/724, 725, 728, 729, 118/730; 437/233, 243, 925, 967, 963; 427/248.1; 219/339; 422/186.05

[56] References Cited

U.S. PATENT DOCUMENTS

| | | | |
|---|---|---|---|
| 3,916,822 | 11/1975 | Robinson | 118/49 |
| 4,421,786 | 12/1983 | Mahajan et al. | 427/82 |
| 4,496,609 | 1/1985 | McNeilly et al. | 427/55 |
| 4,533,820 | 8/1985 | Shimizu | 118/724 |
| 4,654,509 | 3/1987 | Robinson et al. | 219/405 |
| 4,680,451 | 7/1987 | Gat et al. | 219/411 |
| 4,755,654 | 7/1988 | Crowley et al. | 219/405 |
| 4,789,771 | 12/1988 | Robinson et al. | 219/405 |
| 4,798,165 | 1/1989 | de Boer et al. | 118/715 |
| 4,800,105 | 1/1989 | Nakayama et al. | 427/253 |
| 4,823,735 | 4/1989 | Pichel et al. | 118/730 |

FOREIGN PATENT DOCUMENTS 2181458 4/1987 United Kingdom .

OTHER PUBLICATIONS

Van Pul et al., Manufacturing Methods, Techniques and Automated Controls for the Continuous Epitaxial Processing of Silicon Integrated Circuits, vol. 1, Technical Report AFML-TR-78-47, May, 1978, Motorola, Inc.

*Primary Examiner*—J. Woodrow Eldred
*Attorney, Agent, or Firm*—Fliesler, Dubb, Meyer & Lovejoy

[57] ABSTRACT

A reaction chamber for a controlled reaction on a reaction surface of a sample provides for controlled distribution of radiant energy over the reaction surface to offset radiant heat loss of the sample, and establishes uniform distribution of reactant flow on the sample. A lamp housing supplies radiant energy over the sample, which absorbs at least a component of the radiant energy. A support member which supports the sample within the reaction chamber is formed of a material which is essentially transparent to the radiant energy so that it does not behave as a susceptor. An array of lamps, is mounted with the reaction chamber so that direct radiant energy is transmitted through a window to the reaction surface of the sample. A reflecting surface on the housing includes a lamp seat for each lamp in the array with an individually specified position, curvature and tilt with respect to the reaction surface. A source of reactant gas is coupled through a gas port to the reaction chamber between the window and the reaction surface. A reactant distribution plate is mounted between the gas port and the reaction surface, and causes distributed flow of reactant gas over the reaction surface. The distribution plate includes a plurality of perforations having a pattern which determines the distribution of reactant gas flow.

55 Claims, 10 Drawing Sheets

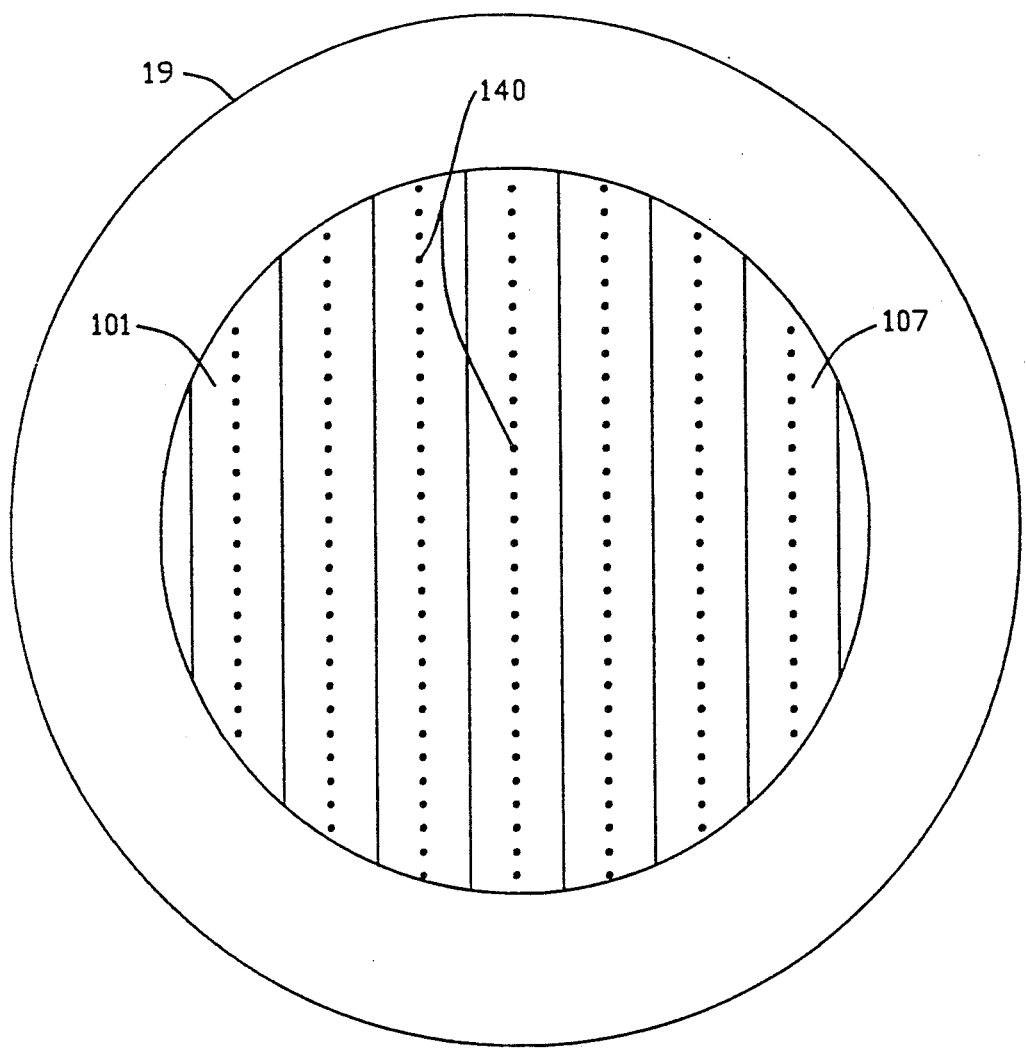
FIG.-5
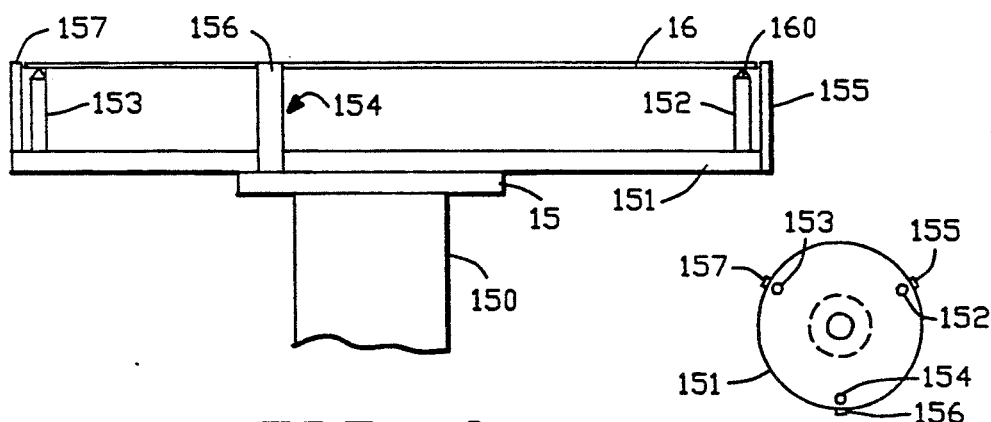
FIG.-6
FIG.-6A

REACTION CHAMBER WITH CONTROLLED RADIANT ENERGY HEATING AND DISTRIBUTED REACTANT FLOW

FIELD OF THE INVENTION

The present invention relates to apparatus for inducing a process such as chemical vapor deposition on a reaction surface of a sample, in which uniform heat distribution and distribution of reactant are desirable. More particularly, the present invention provides a reaction chamber for chemical vapor deposition, or other processes, on semiconductor wafers in which gradients in temperature across the sample and in concentration of reactant across the reaction surface are minimized.

DESCRIPTION OF RELATED ART

Chemical vapor deposition processes are exemplified by the process and apparatus described in U.S. Pat. No. 4,496,609 entitled CHEMICAL VAPOR DEPOSITION COATING PROCESS EMPLOYING RADIANT HEAT AND A SUSCEPTOR to McNielly et al. The CVD apparatus includes a reaction chamber in which a sample is supported. The sample is heated to a reaction temperature and a reactant gas is supplied to the reaction chamber. When the reaction gas contacts the heated reaction surface of the sample, a film of a desired material is grown. One type of film is an epitaxial semiconductor layer grown on top of another semiconductor wafer.

In CVD processes growing single crystal films, it is very important to avoid temperature gradients across the reaction surface. The temperature gradients cause crystallographio slip which degrades the quality of the CVD grown film and causes non-uniform growth.

In addition, in CVD processes, it is desirable that the thickness of the grown film is uniform over the entire reaction surface. Therefore, concentration and mass transport gradients of the reactant gas which contacts the reaction surface should be minimized.

The CVE apparatus shown in the McNielly et al. reference, uses what is known as a cold wall reaction chamber. The reaction chamber has cooled walls and a window through which radiant energy is transmitted. Inside the reaction chamber, a susceptor which absorbs the radiant energy, and supports the samples on which the CVD process is to be performed, is mounted. Radiant energy heats the susceptor, or both the susceptor and the samples directly.

A major component of heat loss out of the samples is radiant heat loss. It is well known that the amount of heat lost due to radiation is proportional to the fourth power of the temperature gradient at a given point in the material. Therefore, at the edges of the sample, much greater heat loss occurs than in the center of the sample. The wide, heated susceptor minimizes the temperature gradients at those edges and helps to maintain a uniform temperature distribution across the reaction surface of the samples.

Susceptors, however, are undesirable in that they are also subject of the CVD process to varying extents. Therefore, they must be cleaned or discarded periodically and replaced with new susceptors. Also, as the CVD process operates, the surface of the susceptor on which samples are supported becomes uneven. This causes voids underneath the samples in which the C,D process may seep and cause growth of a film on the backside of the sample. This is undesirable in that it prevents the samples from laying flat, which may be critical in subsequent processing steps along a semiconductor manufacturing line.

In prior art CVD systems, it has been difficult to establish a uniform flow of reactant gas onto the reaction surface. Non-uniformity can result in nonuniform growth of the film. The difficulty in establishing a uniform flow arises, in part, from interference with the gas flow dynamic by the susceptor, and other sample support mechanisms. Also, the gas flow dynamic is disturbed by the requirement that the gas port be mounted out of the path of the radiant energy illuminating the sample.

SUMMARY OF THE INVENTION

The present invention provides a reaction chamber using controlled radiant heating of a sample without a susceptor to establish uniform temperature distribution across the sample, and providing a distributed flow of reactant across the reaction surface.

According to one aspect, the present invention provides an apparatus for supplying radiant energy over a sample having a reaction surface. The sample absorbs at least a component of the radiant energy and is characterized by a non-uniform distribution of heat loss, such as may be caused by radiant heat loss in a cold wall reaction chamber. The apparatus comprises a reaction chamber and a sample support member which supports the sample within the reaction chamber. The support member does not behave as a susceptor, and in one embodiment is formed of a material which is essentially transparent to the radiant energy.

A source of radiant energy, such as an array of lamps or a single lamp, is mounted with the reaction chamber so that direct radiant energy is transmitted through a window in the reaction chamber to the reaction surface of the sample. A lamp housing supports the lamps between the window on the reaction chamber and a reflecting surface on the housing. The reflecting surface includes a lamp seat for each lamp in the array with an individually specified position, curvature and tilt with respect to the reaction surface. Thus, the direct radiant energy from the lamps and radiant energy reflected from the reflecting surfaces on the lamp housing combines to form a controlled distribution of radiant energy at the reaction surface which offsets the nonuniform distribution of heat loss on the sample and minimizes temperature gradients on the reaction surface.

According to a second aspect, the invention provides an apparatus supplying a flow of reactant over a reaction surface on a sample being heated by radiant energy. The apparatus, according to this aspect, includes a reaction chamber having a window transparent to the radiant energy absorbed by the sample. A support member within the reaction chamber supports the sample so that the reaction surface faces the window. A source of reactant gas is coupled through a gas port to the reaction chamber between the window and the reaction surface. A reactant distribution plate, mounted between the gas port for the source of reactant gas and the reaction surface, causes distributed flow of reactant gas over the reaction surface.

The reactant distribution plate, according to one embodiment, forms a reactant gas receiving chamber between the window of the reaction chamber and the distribution plate. The distribution plate includes a plurality of perforations having a pattern which determines the distribution of reactant gas flow. The source of reactant gas supplies gas to the receiving chamber which behaves as a plenum for distributing the flow of reactant gas directly onto the reaction surface. An exhaust port is supplied in the reaction chamber for letting gas out of the reaction chamber to maintain the distributed flow of reactant. In one embodiment, the reactant distribution plate, the reaction surface and the exhaust port are in line so that the support mechanism does not disturb the flow of reactant gas onto the reaction surface. This causes a symmetrical pressure gradient over the reaction surface which maintains the distributed flow of reactant with minimum concentration gradients over the reaction surface.

According to a third aspect, the invention provides an apparatus for inducing a controlled reaction on a reaction surface on a sample, which combines in a single system, a lamp housing establishing a controlled distribution of radiant energy over the reaction surface with a reactant distribution system establishing the uniform distribution of reactant flow.

Other aspects and advantages of the present invention can be determined upon review of the figures, detailed description and the claims which follow.

BRIEF DESCRIPTION O THE FIGURES

FIG. 5 is a view of the lamp housing illustrating the air cooling ports along the lamp seats.

FIG. 6 is an enlarged side view of the sample support member for the chamber of FIG. 1.

FIG. 6A is a top view of the sample support member illustrating the position of the support pins.

DETAILED DESCRIPTION

Figure 1:
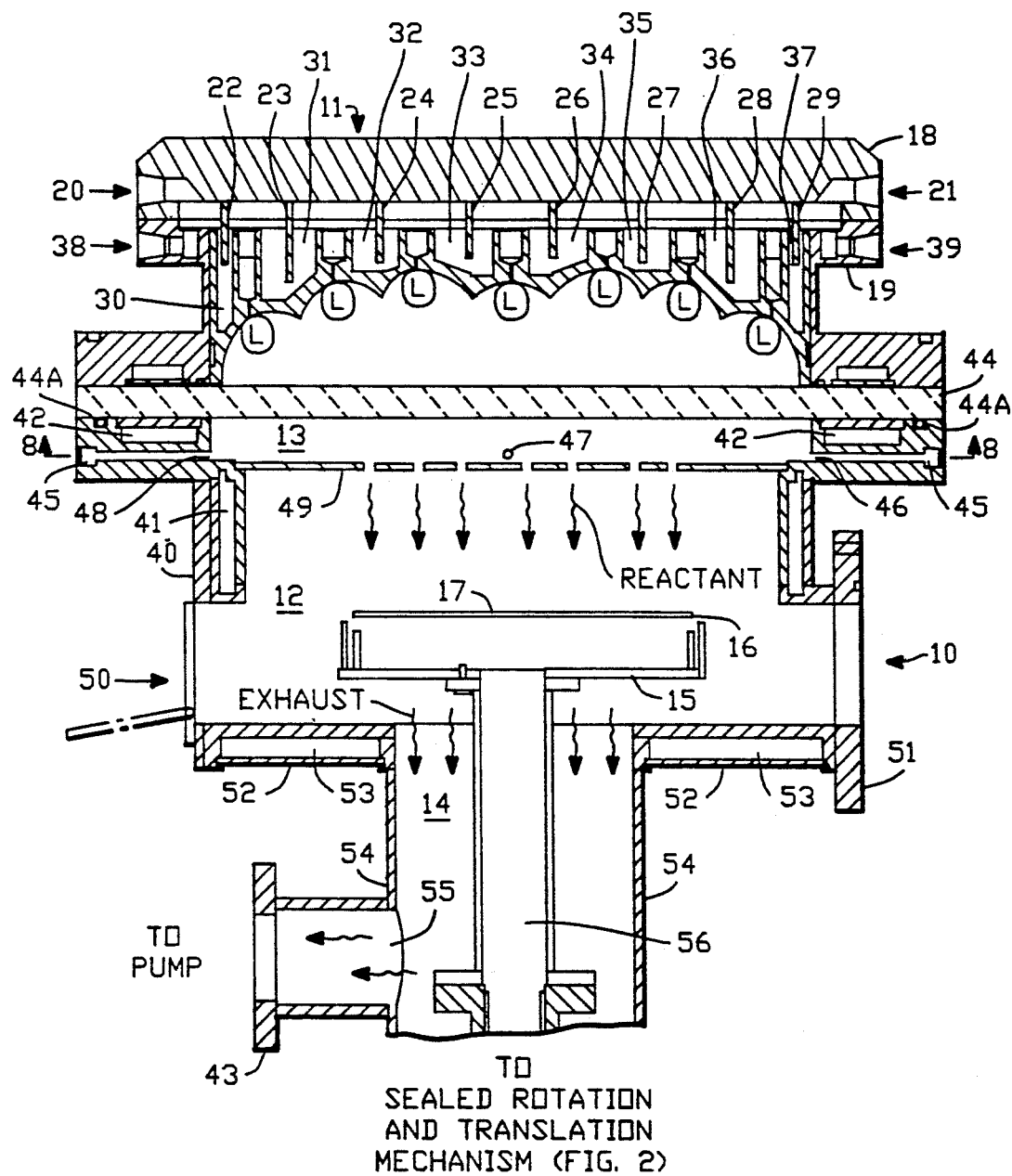
FIG. 1 is a cross-sectional view of a preferred embodiment of a reaction chamber according to the present invention.

A detailed description of a preferred embodiment of the present invention is described with reference to the figures.

A. REACTION CHAMBER OVERVIEW

FIG. provides a side view of the reaction chamber 10 and lamp housing 11 according to the present invention. Reaction chamber 10 includes three major areas. The first area, generally designated by the reference numeral 12, forms a wafer transport and support compartment for the reaction to be performed. The second area, generally designated by the reference numeral 13, forms a reactant gas receiving compartment. The third compartment, generally designated by the reference numeral 14, forms a path for a flow of exhaust gases from the chamber.

Figure 2:
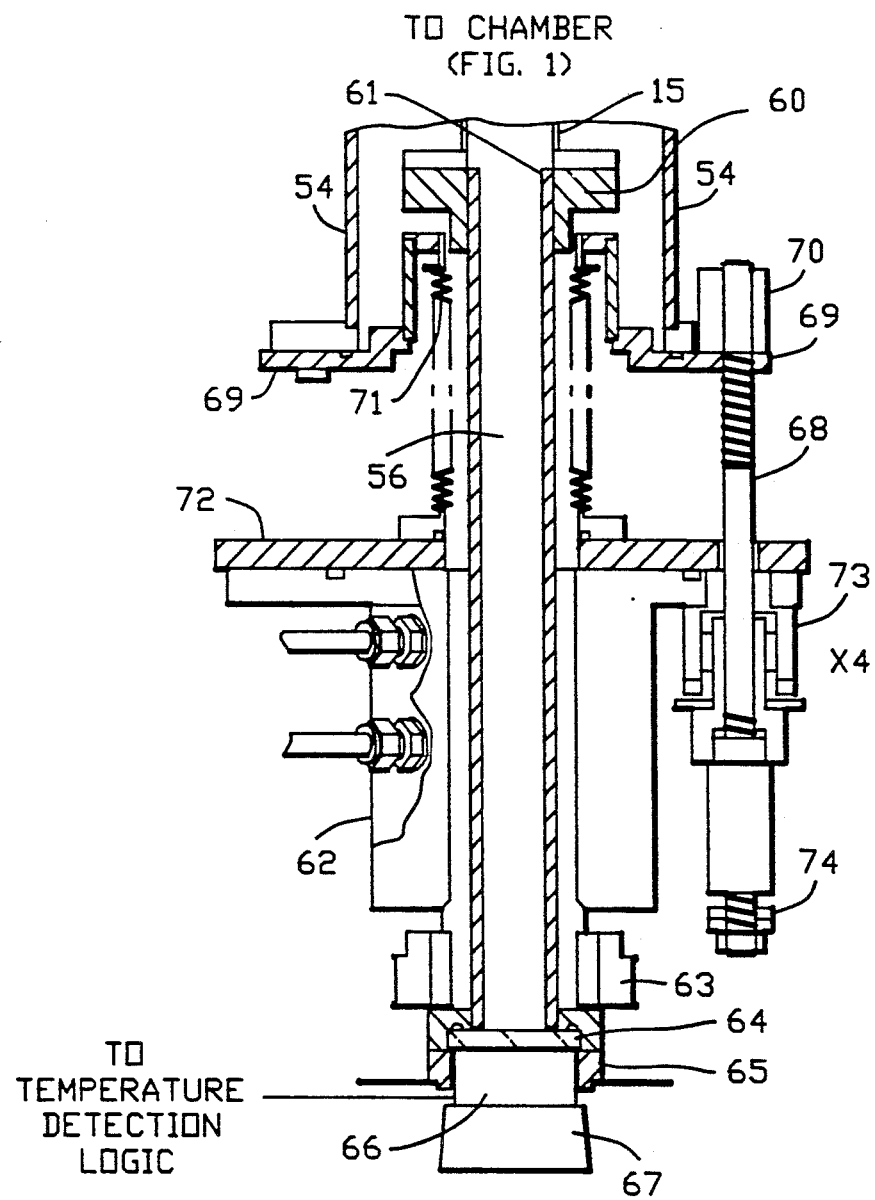
FIG. 2 is a view of the mechanism for translation and rotation of the sample support member for the reaction chamber of FIG. 1.

A sample support member 15 is mounted within the chamber on a mechanism for rotation and translation of the support member 15. The mechanism for translation and rotation is shown in FIG. 2.

The support member supports a sample 16, such as a slice of semiconductor material, with a reaction surface 17 facing the lamp housing 11. The structure of the support member 15 is illustrated with reference to FIGS. 6 and 6A. The support member 15 is a "cold support means" in the same sense that the reaction chamber is a cold wall reaction chamber. That is, the support member 15 is designed so that it does behave as a susceptor of the energy inducing heat in the sample. Further, it remains cool relative to the sample, so that the reaction is minimized on the support member 15.

The lamp housing 11 includes a head piece 18 and a base piece 19 The base 19 and head 18 are secured together to form a plenum for a liquid cooling medium. The liquid enters input nozzle 20 and exits output nozzle 21, after flowing through the path defined by the fins 22, 23, 24, 25, 26, 27, 28 and 29, which are secured to the head piece 18 and the channels 30, 31, 32, 33, 34, 35, 36 and 37, which are cut in the base piece 19. The cooling medium may be water in a preferred system, but any suitable liquid can be used.

The base piece 19 further includes an air cooling plenum through which a cooling gas flow enters from nozzle 38 and/or 39. The detailed structure of the base 18 of the lamp housing 11 is described with reference to FIGS. 3-5.

The base 19 of the lamp housing 11 includes a plurality of lamp seats formed by concave reflective surfaces which distribute radiant energy according o a controlled pattern on the reaction surface 17 of the sample 16 in the reaction chamber. The reaction chamber 10 is a cold wall chamber which is formed basically of a stainless steel or aluminum cylinder 40 with cooling fluid passages (e.g. 41 and 42) a surrounding the interior of the chamber.

The chamber can be evacuated through the pump flange 43 to a relatively high vacuum state. As the sample 16 is heated by the radiant energy, the exterior of the reaction chamber 10 remains cool. Significant heat loss from the sample 16 occurs therefore by radiant heat loss. Heat loss also occurs due to convection in to the carrier gas.

The chamber 10 is sealed between the lamp housing 11 and the receiving compartment 13 by a quartz window 44 and O-ring 44A. The quartz window 44 is transparent to the range of radiation which is absorbed by the sample 16 to cause radiant heating of the sample. The window 44 could be formed of any suitable material which is essentially transparent to the preferred range of radiant energy for a given application.

Quartz utilized for the window 44 absorbs a portion of the long wavelength IR light of the output spectrum of the lamps. It is desirable to prevent this long IR light from entering the reaction chamber 10 and heating the walls and distribution plate. Thus, the window is formed ½ to ¾ inches thick, to act as an IR filter and a sink for heat resulting from absorption of the long IR radiation.

Figure 8:
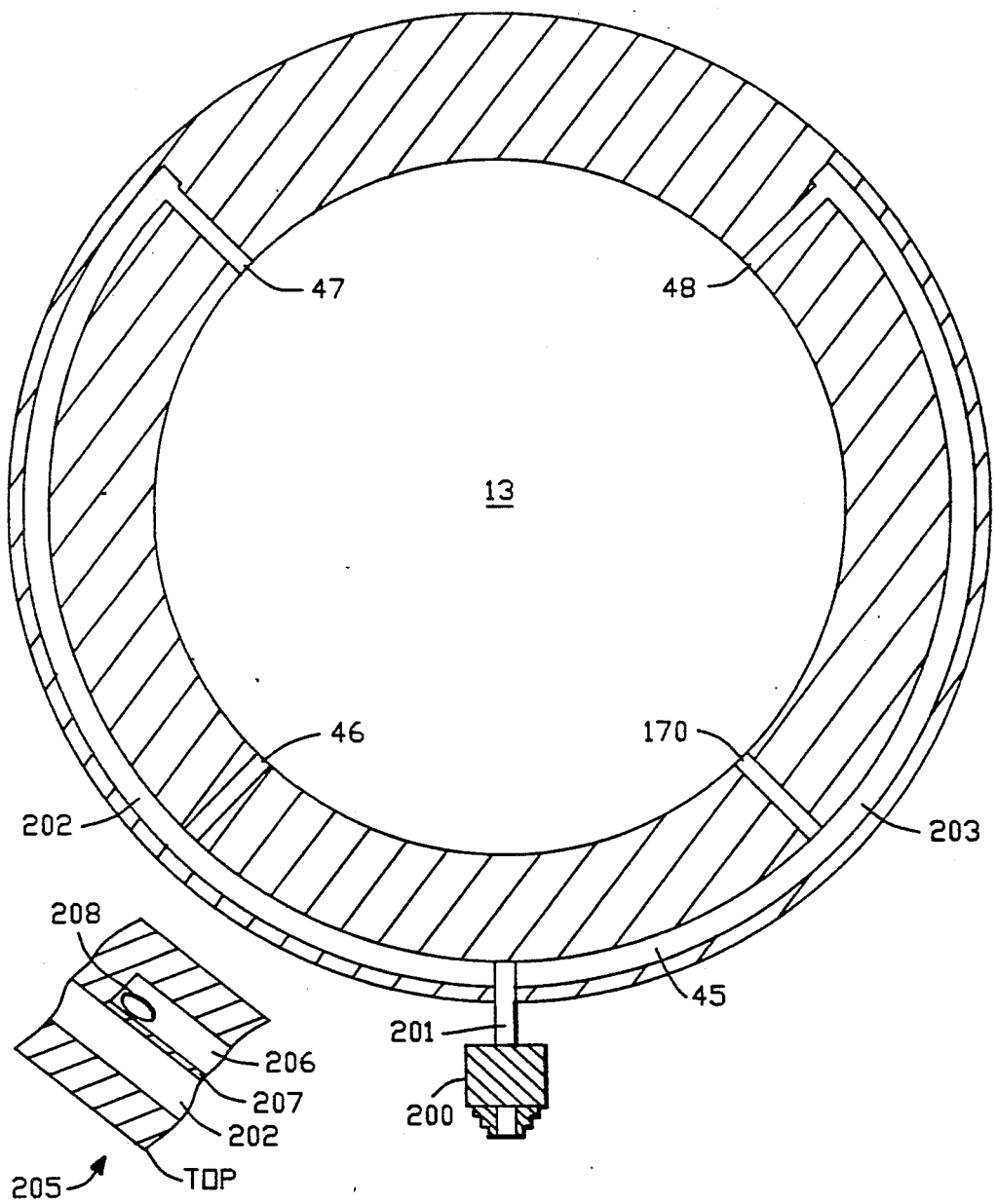
FIG. 8 is a cross-section cut at line 8—8 through the reaction chamber as shown in FIG. 1, illustrating the symmetrical reactant gas port arrangement.

The receiving compartment 13 is coupled to receive a reactant gas through channel 45 and a plurality of reactant ports 46, 47 and 48, as illustrated in FIG. and a fourth port shown in FIG. 8. The arrangement of the gas ports in the receiving compartment 13 is more clearly shown with reference to FIG. 8.

Gas flows through the gas ports into the receiving chamber 13. A baffle 49 with a plurality of perforations (shown in FIG. 7) forms the boundary between the receiving compartment 13 and the main reaction compartment 12. The baffle is formed of quartz material or other material transparent to the range of radiation to be absorbed by the sample 16.

The baffle 49, in combination with the receiving compartment, operates to distribute the reactant gas over the reaction surface 17 of the sample 16 so that concentration and mass transport gradients which may cause irregularities in the reaction process are minimized across the reaction surface 17.

The main chamber 12 is further characterized by vacuum port 50 which is schematically illustrated. This port allows for insertion and removal of sample 16 to and from the reaction chamber 10. Any well known sample handling process and mechanism can be used.

Opposite the vacuum port 50 is flange 51. This flange 51 can be used for a quick access port to the reaction chamber. Additionally, a second vacuum port could be added on this flange 51.

In an operational system, the flange 51 is sealed shut, as is the vacuum port 50, when the reaction is being carried out.

The third compartment 14 of the reaction chamber 10 is a narrowed cylindrical extension of the main compartment 12. Thus, the vertical wall 40 is coupled to horizontal wall 52 through which cooling fluid flows in passage 53. Wall 52 is coupled to vertical wall 54 which extends to a sealed rotation and translation mechanism as shown in FIG. 2. An exhaust port 55 is formed in the wall 54 inside the exhaust compartment, which is coupled to the pump flange 43. The pump flange 43 is coupled to a vacuum pump which draws gas out of the reaction chamber 10.

Thus, in operation, a sample 16 is placed on the support member 15 so that the reaction surface 17 sits on a reaction plane facing the source of radiant energy in the lamp housing 11. The chamber is evacuated and the lamps are energized. The lamps generate a controlled distribution of radiant energy at the reaction plane in the compartment 12 of the reaction chamber 10. The controlled distribution offsets the distribution of radiant heat loss on the sample 16 and causes an essentially uniform temperature across the entire reaction surface 17.

The temperature of the sample 16 is detected through the tubular interior 56 of the support member 15, as shown in FIG. 2. Other alternative positions for the sensor would eliminate need for a tubular interior 56 of the support member 15. For instance, the temperature sensor could be placed above the sample to directly detect reaction surface temperatures, if desired.

Reactant gas can be supplied to the receiving chamber 13 before, during or after desired temperature is reached. Receiving chamber 13 behaves as a plenum for the reaction gas which passes through the baffle 49 in a controlled distribution onto the reaction surface 17. A pump connected to the pump flange 43 draws exhaust gases through the exhaust port 55. Because this exhaust port 55 is located in the exhaust compartment 14, a gas flow path is established by which gas from the baffle 49 flows down over the reaction surface 17 of the sample 16 and essentially symmetrical around the sample into the exhaust chamber 14. This establishes a basically symmetrical gas flow dynamic which minimizes concentration gradients across reaction surface 17.

The gas flow is schematically illustrated by the arrows labeled "REACTANT" and "EXHAUST" in FIG. 1.

B. ROTATION AND TRANSLATION MECHANISM

FIG. 2 illustrates the mechanism for rotating and translating the support member 15 of FIG. 1. The support member 15 is coupled to a mount flange 60. The mount flange 60 is coupled to a rotation shaft 61 which extends into a rotary feedthrough 62, such as are commercially available from Ferrofluidic, Inc. Feedthrough 62 behaves as a bearing and a vacuum seal.

The shaft 61, after passing through the feedthrough 62, is coupled to pulley 63, which is driven by a motor to cause rotation of support member 15. Rotation of the support member 15 is required because, in the preferred embodiment, the lamps seats in the lamp housing are formed to establish a rectangular symmetry for the distribution of radiant energy at the reaction plane. By rotating the support member, a sample with a circular symmetry receives a circularly symmetrical distribution of radiant energy absorption.

The rate of rotation can be varied from less than one to over 1000 revolutions per minute depending on the application.

The shaft 61 is sealed by a window 64 and mounted on a bearing 65. The window 64 can be mad ®of calcium fluoride (CaF) or quartz or any material suitable for the emission spectrum of the sample. A radiant energy detector 66 is mounted at the base of the bearing 65 and detects, through the cylindrical bore of the shaft 61 and the support member 15, the temperature of the sample 16 in the reaction chamber. Detector 66 is mounted on a support base 67.

Translation of the support member 15 is accomplished by one or more worm gears, e.g., worm gear 68 is shown. One worm gear is used in a preferred embodiment. This structure is mounted with the wall 54 of the reaction chamber 10. Wall 54 is coupled to a translation plate 69 on which bearing 70 is mounted to receive the worm gear 68. The translation plate is coupled to vacuum bellows 71 which allows for expansion of the wall of the reaction chamber. The vacuum bellows 71 is mounted to a support plate 72 on which the feedthrough 62 is mounted. The support plate 72 also includes bearing 73 for worm gear 68. The worm gear is coupled to a belt drive system exemplified by the pulley 74 in the figure. This belt drive system is used to raise and lower the support member 15 in the reaction chamber.

Raising and lowering the support member 15 is used during insertion and removal of the sample 16, for changing the relationship of the reaction surface 17 to the distribution of radiant energy caused by the lamp housing 11, and for affecting gas flow dynamics in the compartment 12. Thus, the sample 16 may be moved closer to or farther away from the lamps and baffle as desired for a particular reaction. In the preferred system, the sample position is designed to be 0.5 to 2 inches from the bottom of baffle 49, with the optimal position usually at 1 inch.

C. LAMP HOUSING

Figure 3:
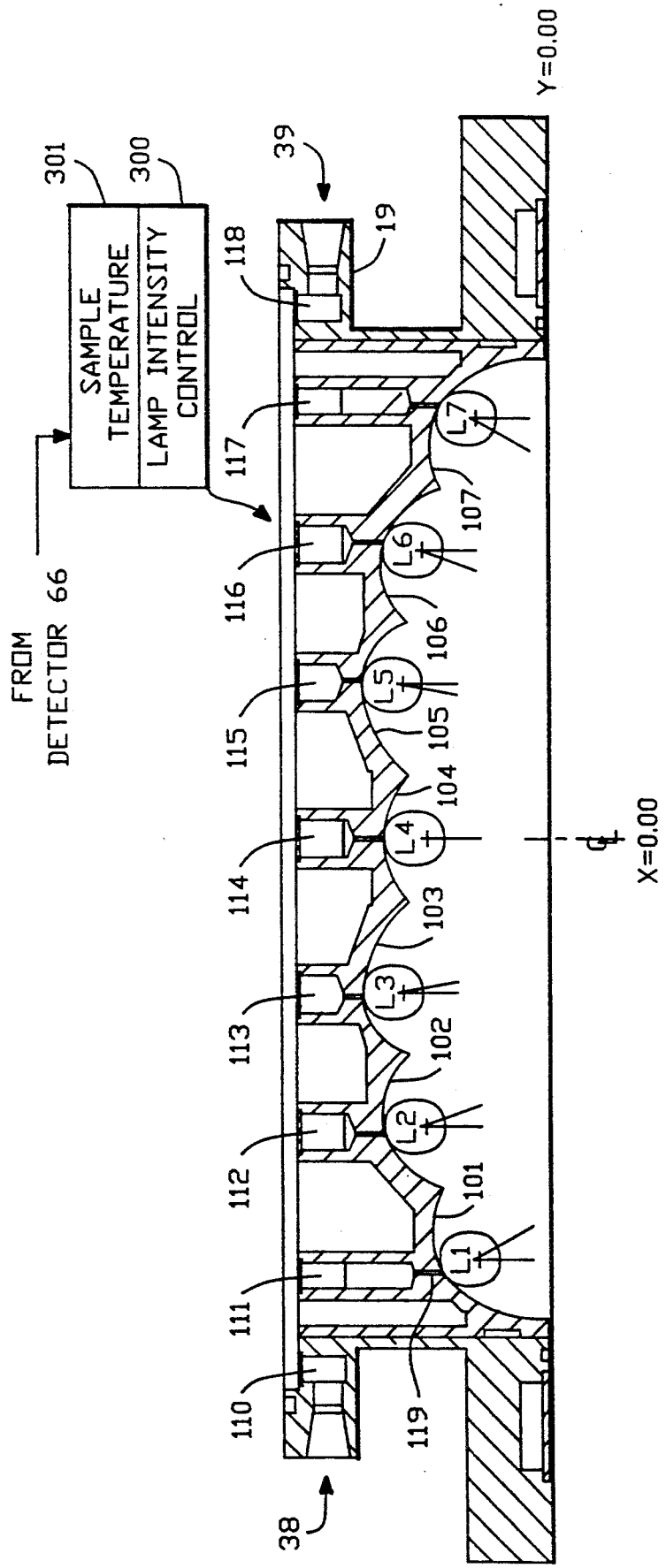
FIG. 3 is an enlarged view of the lamp housing for use with the reaction chamber of FIG. 1.

FIG. 3 is an enlarged view of the lamp housing base 19 with schematic representation of the lamp intensity control 300 and temperature detector logic 301. The lamp intensity control system is described with reference to FIGS. 9–11. The lamp housing base 19 supports a plurality of linear heat lamps, such as tungsten halogen lamps, in the form of elongated tubes which extend through the lamp housing. The lamps are designated L1 through L7 in FIG. 3. The lamps L1–L7 are of selected lengths to accommodate the circular housing shape. The peak energy per unit length of all lamps is the same.

Each of the plurality of lamps L1 through L7 is mounted within a respective lamp seat 101, 102, 103, 104, 105, 106 and 107. Each lamp seat is a concave reflective surface adapted to direct reflected radiant energy from the lamp to the reaction surface of the sample. The concave lamp seats are preferably formed with the curved or conical geometries, but could take on straight line geometries (triangle, pentagon, etc.) if required for a given application or method of manufacture. The reflective surfaces are highly polished and coated with gold or another high reflectivity coating in the preferred system, for reflectivity and durability.

The combination of reflected radiant energy with the direct radiant energy from the lamp forms a controlled distribution of radiant energy at the reaction surface to offset any irregularities in the heat loss distribution on the sample, so that temperature gradients across the reaction surface are reduced.

In the preferred system, the curvatures of the lamp seats are elliptical and a corresponding lamp is mounted essentially at the near focal point of the ellipse. Therefore, the lamp seat can be characterized as having a position, tilt and curvature individually specified to provide the controlled distribution of radiant energy at the reaction surface. In the embodiment illustrated in FIG. 3, the position and tilt of the focal point of each lamp seat is set out in the following table; where the X position is a reference to the center line of the lamp housing and reaction chamber; and the Y position is the height above the base of the lamp housing.

TABLE 1

| LAMP NO. | TILT | X POSITION | Y POSITION |
| --- | --- | --- | --- |
| L1 | 24°00' | −4.125 | 0.813 |
| L2 | 11°30' | −2.840 | 1.313 |
| L3 | 7°30' | −1.450 | 1.563 |
| L4 | 0°00' | 0.00 | 1.313 |
| L5 | −7°30' | 1.450 | 1.563 |
| L6 | −11°30' | 2.840 | 1.313 |
| L7 | −24°00' | 4.125 | 0.813 |

Figure 4:
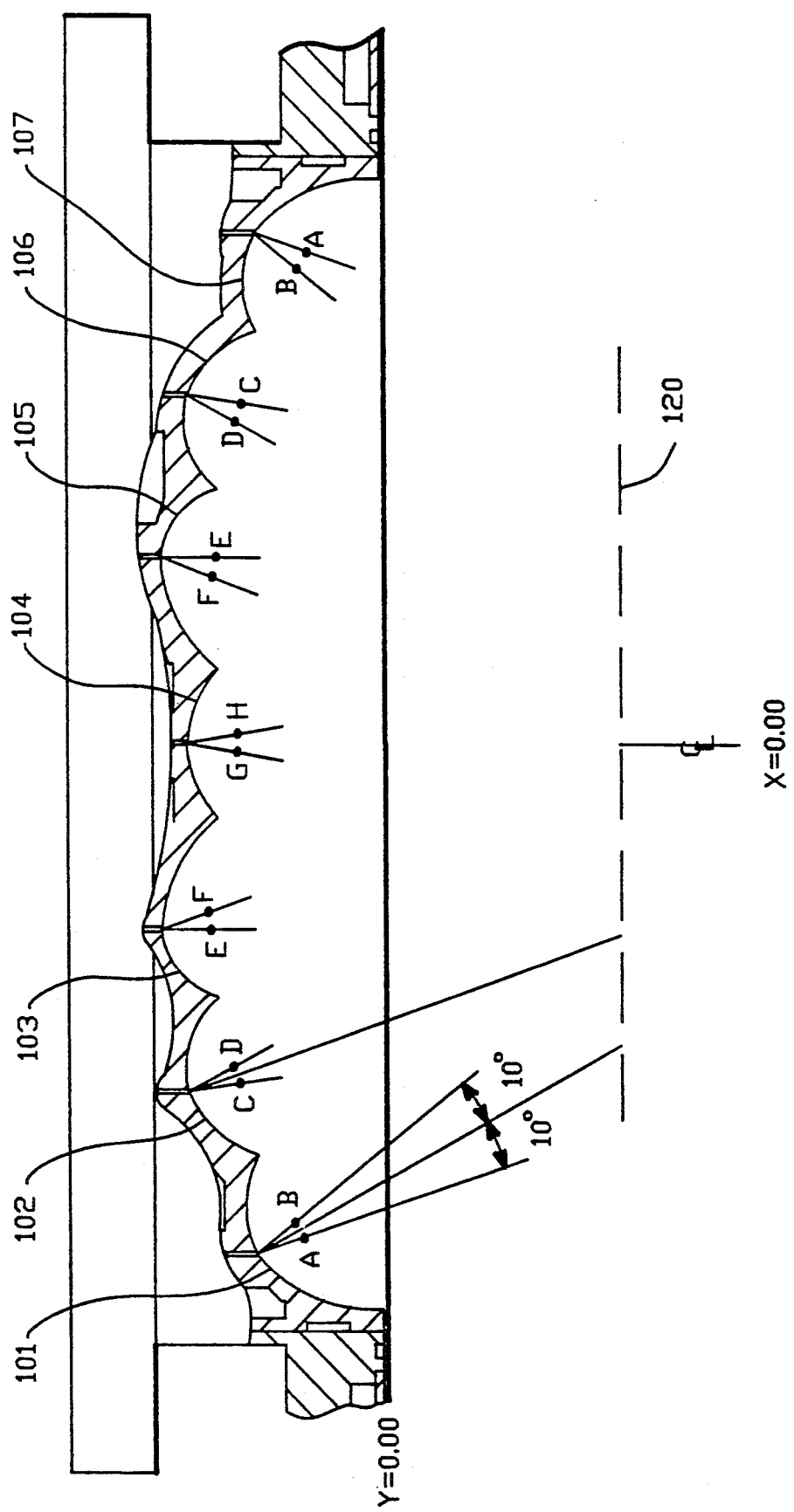
FIG. 4 is a view of the lamp housing showing the individually specified position, curvature and tilt of each of the lamp seats for the lamp housing.

The curvature of each of the lamp seats is illustrated in FIG. 4.

FIG. 3 also shows a clear view of the gas cooling plenum through which gas is supplied at ports 38 and 39. The cooling plenum includes a plurality of interconnected channels 110–118 through which air is supplied. The air in these channels is coupled into the lamp seats through ports, such as port 119 at lamp L1. The lamps are mounted in the openings illustrated in FIG. 3 spaced away from the reflective surfaces in the lamp seats so that passage for cooling air is allowed. The cooling air flows out of the ports, such as port 119, and flows over the lamps and out to the atmosphere.

As mentioned above, FIG. 4 illustrates the curvatures of the lamp seats 101–107. Each lamp seat is comprised of a split elliptical channel which extends along the respective lamp tube. Each half of the split elliptical channel is cut to form an elliptical curve defined by the classical definition of an ellipse:

$$x^2/a^2 + y^2/b^2 = 1.$$

$$c = a \times E$$
$$E = \sin\theta$$

f = the focal point

The elliptical curvature used in the preferred embodiment:

$a = 1.125$ $b = 0.8125$ $c = 0.780$ $E = 0.6933$ $\theta = 44°54'$

Each ellipse in the split ellipse is offset by a tilt of 10° from the tilt of the lamp seat which is set forth in Table 1 above. Thus, each curvature can be characterized by two focal points, such as focal points A and B for lamp seats 101 and 107, focal points C and D for lamp seats 102 and 106, focal points E and F for lamps seats 103 and 105, and focal points G and H for lamp seat 104. Thus, each half of a lamp seat can be characterized by the position of its focal point, and the angle of the long axis of the ellipse defined by the focal point to the vertical as set out in the following table:

TABLE 2

| FOCAL POINT | ANGLE TO VERTICAL | X | Y |
| --- | --- | --- | --- |
| A | (+)(−) 14°00' | (+)(−) 4.129 | 0.769 |
| B | (+)(−) 34°00' | (+)(−) 3.881 | 0.879 |
| C | (+)(−) 1°30' | (+)(−) 2.948 | 1.297 |
| D | (+)(−) 21°30' | (+)(−) 2.682 | 1.351 |
| E | (−)(+) 2°30' | (+)(−) 1.574 | 1.557 |
| F | (+)(−) 17°30' | (+)(−) 1.305 | 1.592 |
| G | (−) 10°00' | (+) 0.135 | 1.325 |
| H | (+) 10°00' | (−) 0.135 | 1.325 |

It can be seen that the average angle of focal points A and B equals to the tilt of lamp seat 101, and so one for each lamp seat.

By using a split ellipse lamp seat, less energy is reflected off of the elliptical surface back into the lamp and more is directed to the reaction surface.

FIG. 4 also illustrates that the central focus of each lamp seat is directed to create a controlled distribution of the energy along a reaction plane 120. The reaction plane would be located in the reaction chamber at the position of the reaction surface on the sample 16.

This controlled distribution for the embodiment shown is determined by computer simulation of the radiation profile generated by the lamps in the lamp housing for a preferred operating condition to establish a known profile, taking into account reflection and refraction at the window and baffle. Each lamp-lamp seat combination generates an energy profile determined by the position of the lamp and the position of the images created by the elliptical surfaces defining the lamp seat. The intensity of each image is in turn determined by the capture angle of the corresponding elliptical reflector. The combined effect of all seven lamp-lamp seat sources creates a controlled distribution of radiant energy at the reaction surface of the sample.

Figure 9:
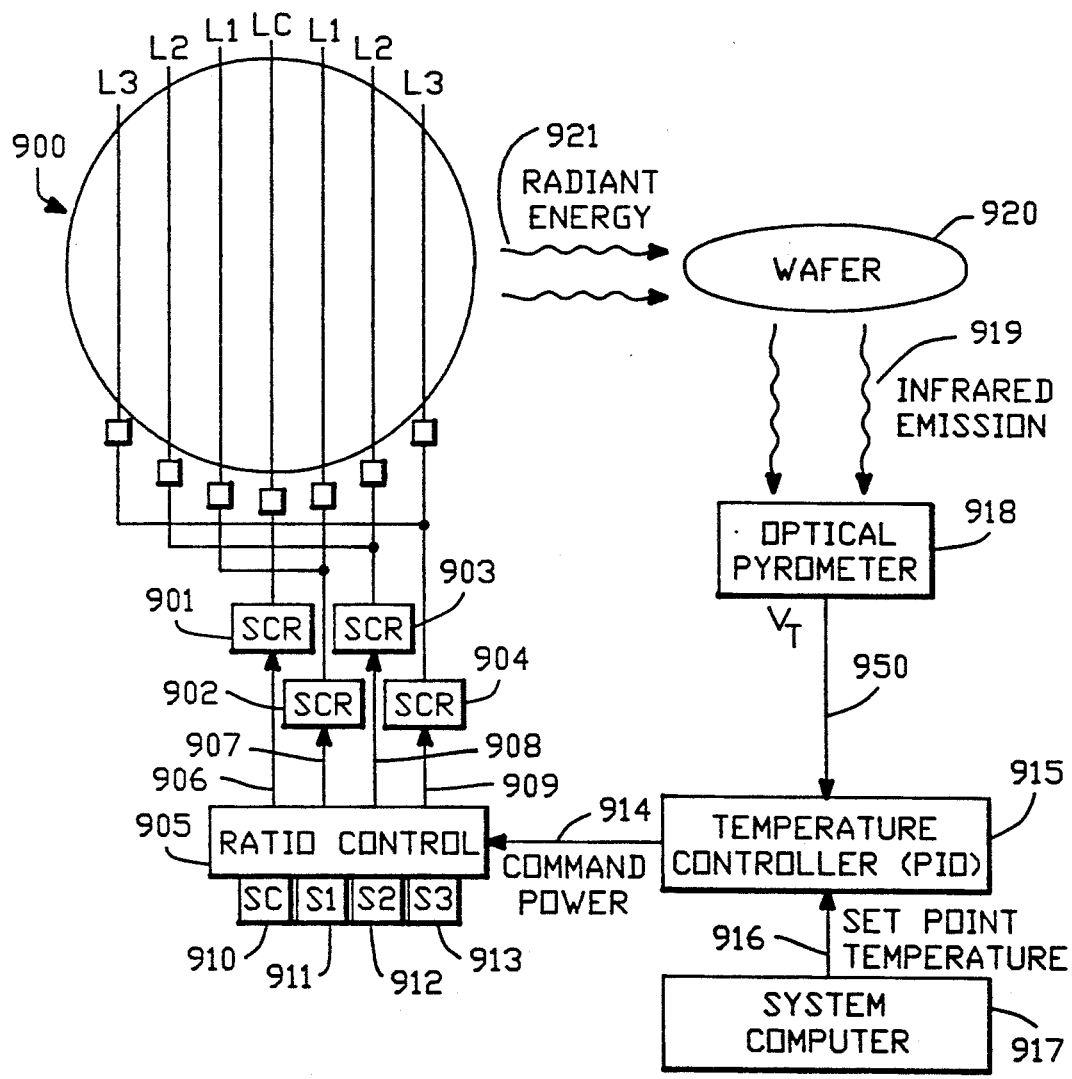
FIG. 9 is a block diagram of one embodiment of the lamp intensity control system according to the present invention, using an analog control loop.
Figure 10:
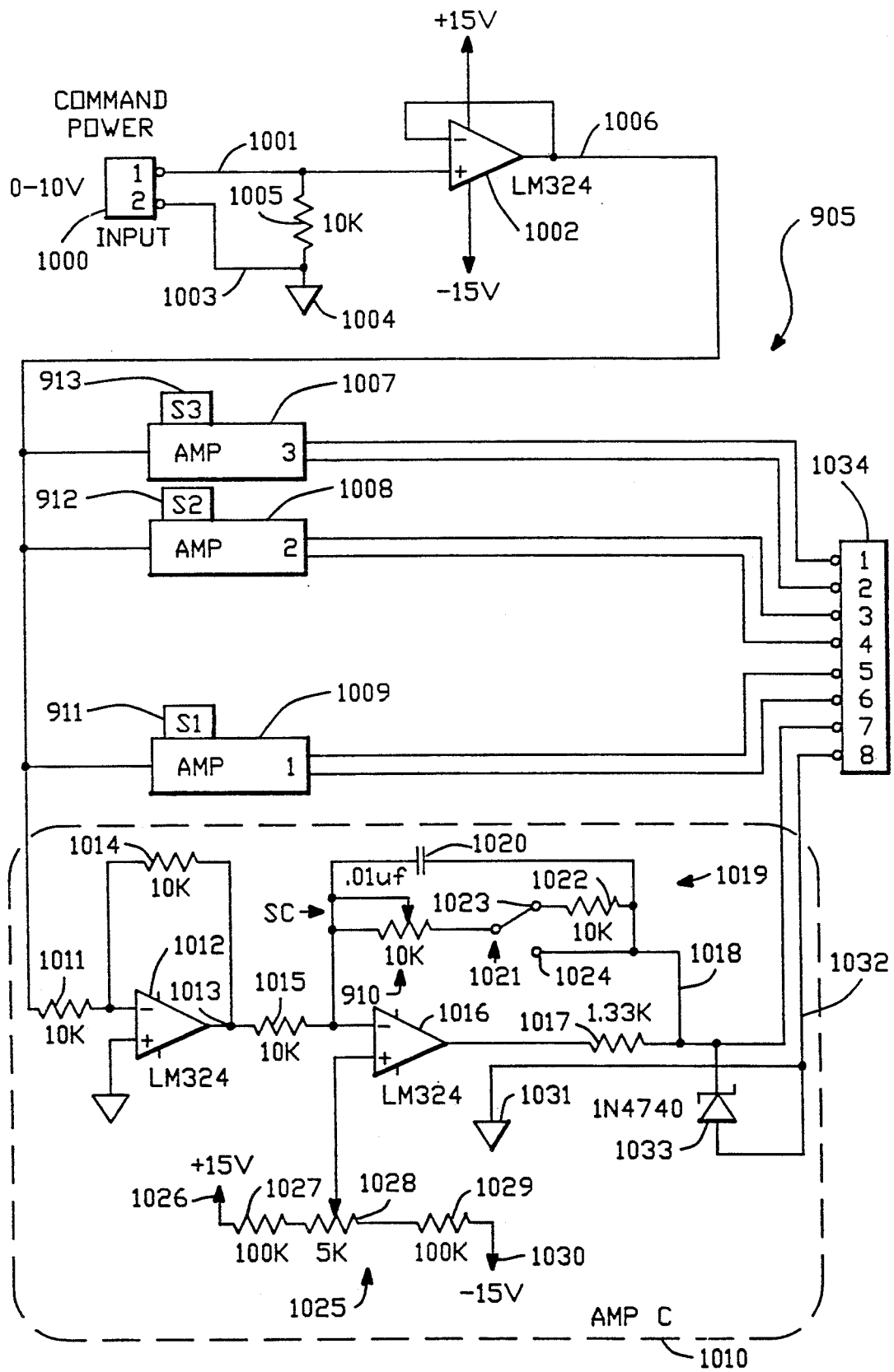
FIG. 10 is a circuit diagram for the ratio controller of FIG. 9.
Figure 11:
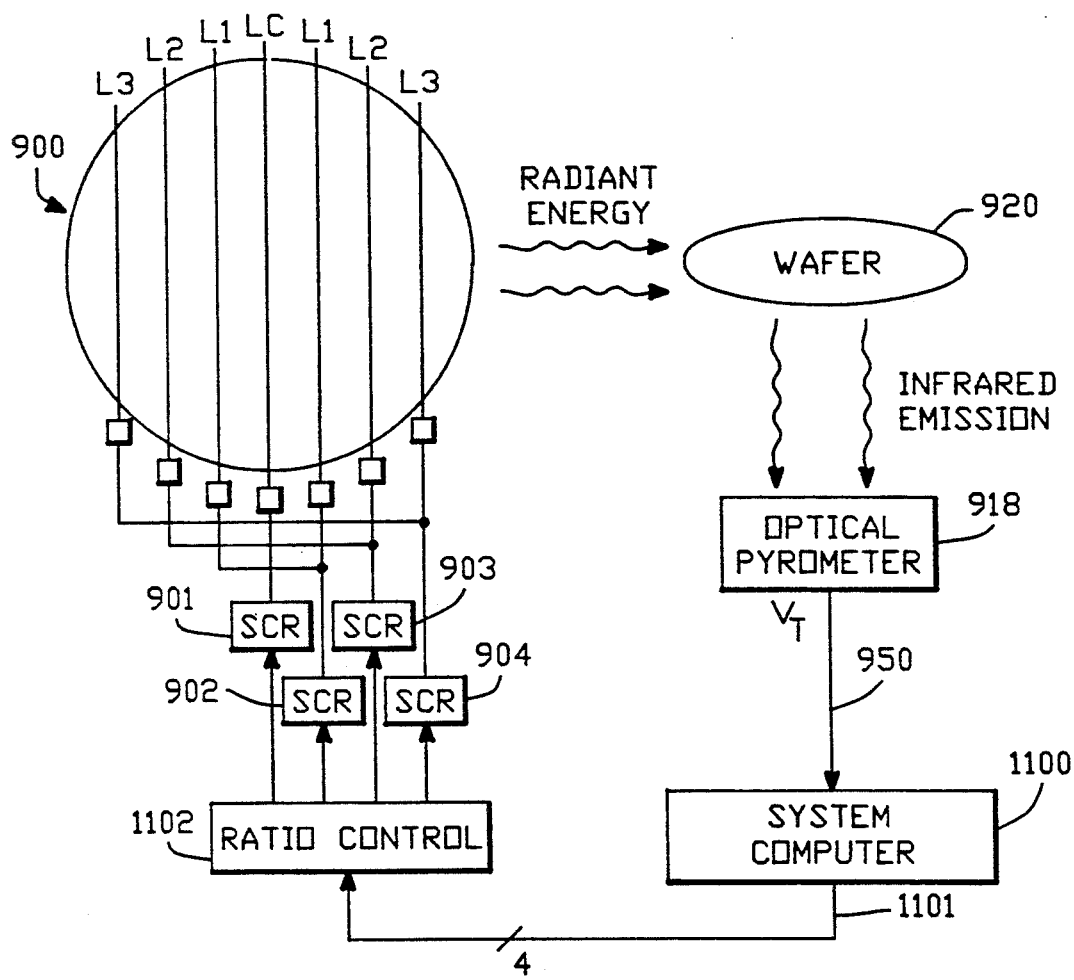
FIG. 11 is a block diagram of an alternate embodiment of the lamp intensity control system, using a digital control loop.

The distribution of radiant energy is then varied by individually controlling, in the lamp intensity control system of FIGS. 9-11, the intensity of the lamps L1-L7 to achieve a distribution required for a given reaction. Individual lamps can be controlled to establish, in combination with selected lamp seat design, any desired pattern of intensity.

The distribution can also be varied by moving the sample up and down in the reaction chamber.

FIG. 5 illustrates the plurality of air cooling ports and the elongated nature of the lamp seats in the lamp housing base 19. Each lamp seat 101 through 107 is an elongated channel of a highly reflective surface. Along the center of each channel is a plurality of gas ports 140 allowing flow of a cooling gas over the lamps mounted in the housing. The lamp ports 140 are coupled to the plenum which receives gas through ports 38 and 39 as discussed with reference to FIGS. 1 and 3.

In alternative systems, the ports 140 could be replaced by slots. Also, ports or slots could be placed outside the lamp seat to provide a cooling medium for removing heat from the quartz window on the reaction chamber.

Alternative energy distribution mechanisms, such as absorbing filters, coatings, or other optics could be used to establish a controlled distribution of radiant energy in the reaction chamber.

D. SUPPORT MEMBER

FIGS. 6 and 6A illustrate the structure of the support member 15. The support member is supported by the shaft 150. On top of the tubular shaft 150 sits a plate 151. Coupled to the plate 151 are three support pins 152, 153 and 154. Guide posts 155, 156 and 157 are used to prevent shift of the sample 16 off of the support pins 152, 153 and 154, when the support member 15 is being rotated, and when inserting the sample 16 onto the support member 15.

The support pins are located as illustrated in FIG. 6A. Thus, pins 152, 153 and 154 are located 120° apart from each other around the circumference of the support plate 151 and define a support plane. The guide posts 155, 156 and 157 are secured to the perimeter of the support plate 151.

The support pins 152, 153, and 154 are formed so that the points (e.g.. 160 on pin 152) are very sharp, having a radius of less than one millimeter. Thus, the contacts on the sample 16 are small, allowing for very little heat loss through the support pins. Thus, the amount of area of the contacts on the support member 15 is much less than the surface area of the reaction surface 17 of the sample 16.

E. REACTANT DISTRIBUTION SYSTEM

Figure 7:
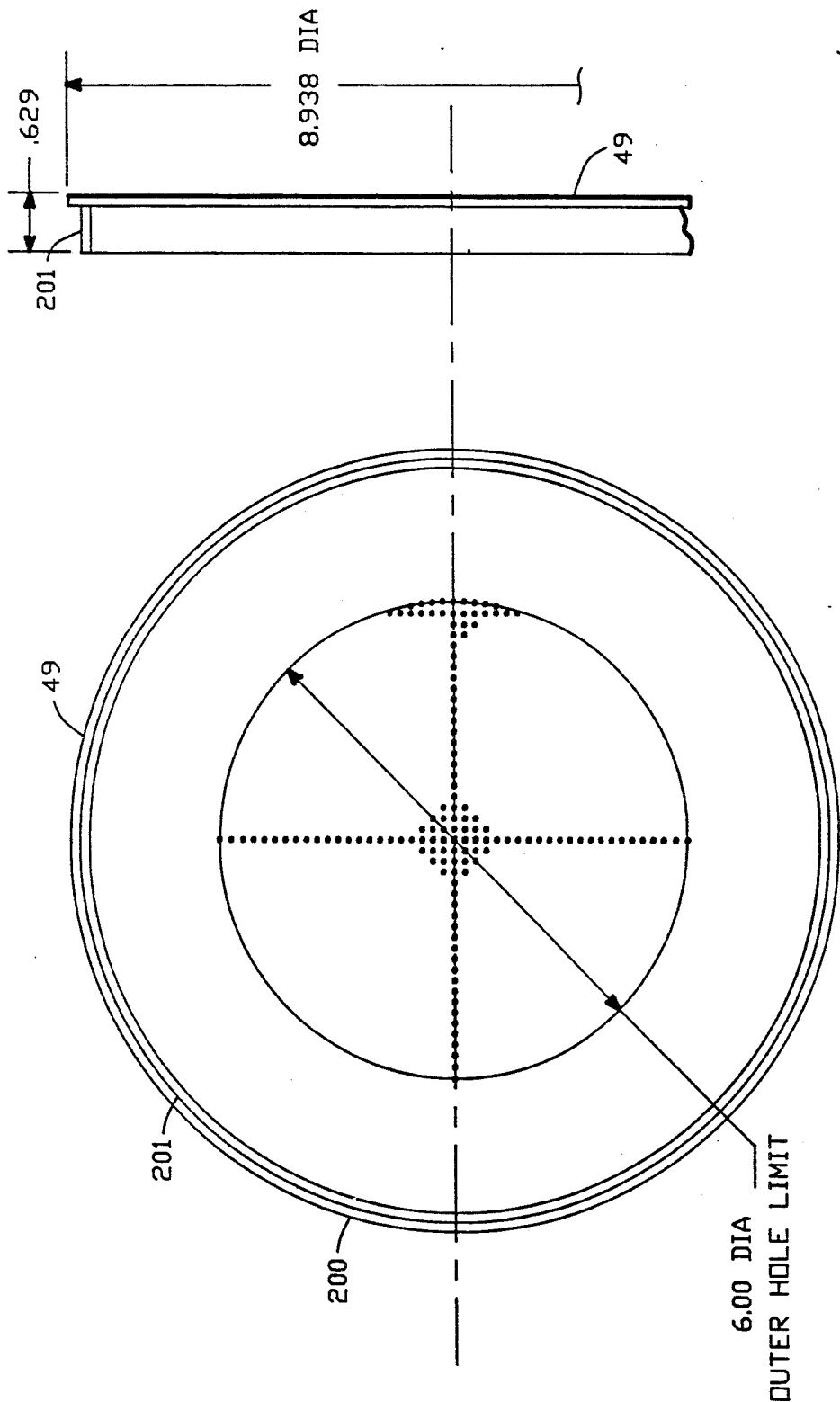
FIG. 7 is a diagram showing top and side views of the reactant gas distribution baffle for the reaction chamber of FIG. 1.

FIG. 7 illustrates the baffle 49 which is used for causing a distributed flow of reactant gas over the reaction surface 17 of sample 16 in the reaction chamber shown in FIG. 1. The baffle 49, illustrated in FIG. 7, is for a sample which is formed of a 6 inch diameter semiconductor wafer. Thus, a plurality of perforations formed in the baffle 49 fall within a 6 inch diameter outer hole limit. The perforations are typically 2 mm in diameter, 4 mm center to center, and formed in parallel rows within the 6 inch diameter circular field illustrated in FIG. 7. Thus, there are approximately 900 holes in the field.

Around the outer perimeter 200 of the baffle 49, a structural tubular member 201 is formed. The side view of the baffle 49 illustrated in FIG. 7 shows the structure of the support tube 201. It is basically a 4 mm thick tubular extension so that the baffle 49 sits on top of a length of tube with a 233 mm outer diameter and a 219 mm inner diameter. The baffle 49 itself is 2 mm thick and 8.983 inches in diameter. The length of the tubular support structure is 0.629 inches. The material of which the baffle is formed is optically polished quartz produced by Heraeus Amersil, T08 commercial type E. It can be formed of any material which is essentially transparent to the range of radiant energy to be distributed over the reaction surface 17 of the sample.

FIG. 8 is a cross-sectional view along line 8-8 of FIG. in the reaction chamber 10 through the gas supply ports 46, 47, 48, 170 and the plenum 45, showing how the reactant gas is distributed symmetrically into the receiving chamber 13. The reactant gas is supplied through valve 200 through tube 201 into plenum 45. The plenum splits into four individual channels to the ports 46, 47, 48 and port 170. The channel 202 from port 47 to the valve 200 is shown and the channel 203 from port 48 to the valve 200 is shown.

A view of the manner in which the channel 202 bypasses the port 46 is shown at 205. It can be seen that a separate channel 206 proceeds below the channel 202 from the valve 200 to port 46. The channel 206 and the channel 202 are separated by wall 207. The bore 208 proceeds from the channel 206 into the receiving chamber 13 through the port 46. The channel to port 170 is formed in a similar manner as the channel 206 to port 46.

An alternative system for providing individual flow channels, could be implemented using tubes plumbed outside the body of the reaction chamber. This alternative may eliminate problems with debris from machining the channels shown in FIG. 8.

By providing individual flow channels in the plenum for reactant gas to the distributed ports, a more uniform reactant flow into the receiving compartment 13 is accomplished. The embodiment described is designed to supply from a few hundred cubic centimeters per minute to over 50 liters per minute.

F. LAMP INTENSITY CONTROL SYSTEM

The lamp intensity control system by which the intensity of each of the lamps is individually controlled is described with reference to FIGS. 9-11. FIG. 9 illustrates an analog control loop for the lamps. FIG. 10 is a circuit diagram of the ratio control circuitry for the system of FIG. 9. FIG. 11 is a block diagram of an intensity control system with a digital control loop.

The system illustrated in FIG. 9 is based on an analog control loop which controls the intensity of each of the lamps in the lamp housing 900. The lamps in the lamp housing 900 are schematically represented by lines labelled LC, L1, L2, or L3. Lamp LC is in the center of the lamp housing 900. The two lamps labelled L1 are adjacent lamp LC. The two lamps labelled L2 are adjacent lamps L1. Finally, the two lamps labelled L3 are the outside lamps on the lamp housing 900.

Each of the lamps is coupled to a silicon controlled rectifier SCR. Thus, lamp LC is coupled to SCR 901. The two lamps labelled L1 are coupled to SCR 02. The two lamps labelled L2 are coupled to SCR 903. The two lamps labelled L3 are coupled to SCR 904. A ratio control power supply 905 delivers four power outputs. Power output 906 is coupled to SCR 90. Power output 907 is coupled to SCR 902. Power output 908 is coupled to SCR 903. Power output 909 is coupled to SCR 904. The maximum power output on each of the four power outputs is set to 100% of the lamp driving intensity. However, in the ratio control power supply, manual potentiometers SC 910 for lamp LC, S1 911 for lamps L1, S2 912 for lamps L2, and S3 913 for lamps L3 are provided so that the ratio of power output for each of the lamps is individually controllable.

Note that in the system described, the lamp pairs L1, L2 and L3 are controlled by a single power output. This provides symmetrical operation of the lamp housing 900. For embodiments in which a symmetrical operation is not desired, individual power outputs are supplied by a straight forward extension of this design.

The ratio control power supply 905 is illustrated in FIG. 10 in more detail.

As input to the ratio control power supply 905, a command power is supplied on line 914 from a temperature controller 915. The temperature controller 915 is formed by a PID analog control circuit. A set point temperature is supplied to the temperature controller across line 916 from system computer 917. A voltage proportional to the temperature is supplied across line 950 from an optical pyrometer 918. The optical pyrometer 918 corresponds to the sensor 66 of FIG. 2.

Infrared emissions 919 from the sample wafer 920 are detected by the pyrometer 918 to generate the output voltage $V_T$ proportional to the temperature on line 950. Radiant energy 921 is delivered to the sample wafer 920 from the lamp housing 900, to complete the control loop.

In operation, the potentiometers 910–913 are set to control distribution of radiant energy on the wafer 920, in combination with the design of the reflective lamp seats in the lamp housing 900 as discussed above.

Manual setting of the ratio control power supply 905 through the potentiometers 910–913 provides rather rough control. The ratio control power supply 905 could be easily adapted to include digitally controllable potentiometers, which, in turn, can be controlled by the system computer 917. By this manner, extremely precise control of the relative powers of the lamps is achieved.

The ratio control power supply 905 is illustrated in FIG. 10. The command power 914 is connected to jumper 1000. Jumper 1000 has a first output 1001 which is connected to the positive input of operational amplifier 1002. A second output of jumper 1000 is connected on line 1003 to a ground terminal 1004. A resistor 1005 is connected from the ground terminal 1004 to the line 1001. The operational amplifier 1002 is connected in a unit gain configuration and acts as a buffer for supplying the command power signal on line 1006 as input to four individual power amplifiers AMP3 1007 for lamps L3, AMP2 1008 for lamps L2, AMP1 1009 for lamps L1, and AMPC 1010 for lamp LC. Each of the four amplifiers is identical so the schematic of AMPC 1010 is the only one described.

Coupled to each lamp, as described with reference to FIG. 9, is a manually settable potentiometer. Thus, potentiometer 913 is coupled to AMP3 1007, potentiometer 912 is coupled to AMP2 1008, and potentiometer 911 is coupled to AMP1 1009. The potentiometer 910 is included within the schematic of AMPC 1010.

The amplifier schematic for AMPC is described. The signal on line 1006 is supplied through resistor 1011 to the negative input of op-amp 1012. The output of op-amp 1012 is coupled on line 1013 through feedback resistor. This provides a unity gain power amplifying stage. The output on line 1013 is coupled through input resistor 1015 to the negative input of op-amp 1016. The output of op-amp 1016 is supplied through resistor 1017 to output line 1018. Output line 1018 is coupled to feedback circuit 1019. The feedback circuit 1019 includes a capacitor 1020 coupled from line 1018 to the negative input of op-amp 1016. Also, the feedback circuit includes a two-position switch 1021. In the first position, the switch is coupled to terminal 1023. Terminal 1023 is coupled through resistor 1022 to line 1018. The second position of the switch is coupled to terminal 1024 which is connected directly to line 1018. The common terminal of the switch 1021 is coupled to potentiometer 910 which is set to control the ratio of the output power. The switch 1021 sets the range of output power by controlling the amplification of the amplifier stage. In the first position of switch 1021, the gain of the amplifier stage is from one to two, depending on the setting of the potentiometer 910. In the second position, the gain of the stage is from zero to one, again depending on the setting of the potentiometer 910.

The positive input to op-amp 1016 is coupled to a zero setting circuit 1025. The zero setting circuit includes a first terminal 1026 coupled to a 15 volts power supply The terminal 1026 is connected through resistor 1027 to potentiometer 1028. Likewise, potentiometer 1028 is coupled through resistor 1029 to a −15 volt supply terminal 1030. The potentiometer 1028 is adjusted to set the zero level of the amplifier stage.

The amplifier stage includes a common terminal 1031 which is coupled to line 1032 as an output of the amplifier stage. A zener diode 1033 is coupled between lines 1032 and 1018 to provide over voltage protection.

Lines 1018 and 1032 are coupled to output jumper 1034. Likewise, the outputs from AMPs 1–3 are coupled to output jumper 1034. The output jumper 1034 is coupled to the SCRs illustrated in FIG. 9.

As an alternative to the analog control loop of FIG. 9, a digital control loop can be utilized as illustrated in FIG. 11 to provide more precise control of the intensities of the lamps. In FIG. 11, the elements which are identical to corresponding elements in FIG. 9 are given the same reference numerals. In the system of FIG. 11, the voltage $V_T$ on line 950 representing the temperature of the wafer on line 917 for the digital control loop is supplied directly to the system computer 1100. The system computer 1100 implements a closed loop software PID controller to generate a power command value. The power command value is then multiplied by the software set ratios to generate four individual lamp power signals on line 1101. Lines 1101 are coupled to ratio controller 1102 which consists of four individual amplifier stages. The four stages of ratio controller 1102 are similar to those described in FIG. 10, except that the potentiometers in the amplifier feedback loops are eliminated. To control the ratio of output power in the ratio control power supply 1102, the input to each of the four amplifier stages is individually controlled by the system computer 1100.

Using the digital control loop of FIG. 11, the intensity of the various lamps for a preferred power distribution can be set with precision. In addition, for a given application, the computer can be used to iteratively calculate and implement optimal lamp intensities.

G. CONCLUSION

It can be seen that the present invention provides a superior reaction chamber adapted particularly for chemical vapor deposition on semiconductor wafers. The chamber is characterized by a controlled distribution of radiant energy over the sample in the chamber, and controlled distribution of reactant gas into the chamber over the sample reaction surface.

A first mechanism by which reactant gases are distributed onto the sample consists of a window made of a material which is transparent to the wavelength of the radiant source and a reactive gas distribution plate made of the same material situated near the window. The radiant source is positioned to the atmosphere side of the window and reactant gases are introduced into the reaction chamber between the distribution plate and the window. The processing sample is placed next to the distribution plate facing the radiant source. The reactive gases are introduced directly onto the sample through openings in the gas distribution plate. The gas distribution plate is further used to control gas dynamics of the reactant gases.

This gas distribution mechanism allows the radiant source to be mounted on the same side of the sample as the direction of flow of the reactive gas onto the sample to optimize sample reaction. Further, it allows a wide range of freedom for the sample support so that it does not interfere with the radiant source or lie in the path of the reactant gas flow. This mechanism for controlling a distribution of reactive gases is useful in any reaction chamber where interference from the sample support mechanism in the introduction of gas and introduction of gas from the same side as the energy source are desired.

The second mechanism forming part of the reaction chamber according o the present invention consists of a housing for an array of linear lamp sources and reflectors that provides for control of the distribution of illumination over a sample. Each lamp seat consists of a reflector with one or two elliptically shaped surfaces. Through refinements in the position, eccentricity and tilt of the elliptical surface, the distribution of the direct and reflected radiant energy is controlled. This design allows accurate control of the radiant energy overall a sample surface where a certain energy profile is desirable.

The controllability of the distribution o radiant energy over a sample surface allows the achievement of uniform temperature across the sample. This is true even when the ample will have a non-uniform distribution of heat loss. Thus the desired radiant energy distribution can compensate for radiant heat loss of a sample at various temperatures in a reaction chamber.

In the foregoing description, a single example of a gas distribution plate and a single example of the lamp housing are described. It will be recognized by those skilled in the art that for a given geometry of sample and type of reaction desired, the distribution of energy and of reactive gas can be adapted by adapting the lamp housing reflector surfaces and the gas distribution baffle. In addition, the rotatable support member may be replaced by a stationary support if the symmetry of heat loss from the sample are matched with the symmetry of the distribution of radiant energy supplied at the reaction surface.

The foregoing description of preferred embodiments of the present invention has been provided for the purposes of illustration and description. It is not intended to be exhaustive or to limit the invention to the precise forms disclosed. Obviously, many modifications and variations will be apparent to practitioners skilled in this art. The embodiments were chosen and described in order to best explain the principles of the invention and its practical application, thereby enabling others skilled in the art to understand the invention for various embodiments and with various modifications as are suited to the particular use contemplated. It is intended that the scope of the invention be defined by the following claims and their equivalents.

What is claimed is:

1. An apparatus for supplying radiant energy over a sample having a reaction surface, the sample absorbing at least a component of the radiant energy, and characterized by a nonuniform distribution of heat loss, the apparatus comprising:
   a reduced-pressure reaction chamber having a wall;
   means, coupled with the reaction chamber, or cooling the wall of the reaction chamber;
   means, mounted with the reaction chamber, for supporting the sample within the reaction chamber, and including a thermally inert support member contacting the sample,;
   means, mounted with the reaction chamber, for generating radiant energy; and
   energy distribution means, mounted with the means for generating, for distribution the radiant energy generated by the means for generating to form a controlled distribution of radiant energy at the reaction surface, and wherein the controlled destruction of radiant energy offsets the nonuniform distribution of heat loss on the sample.

2. The apparatus of claim 1, wherein the support member is mounted within a shadow of the sample so that the radiant energy does not directly strike the support member.

3. The apparatus of claim 1, wherein the support member within the reaction chamber includes three sample contact points defining a support plane and contacting the sample.

4. The apparatus of claim 1, wherein the support member consists of material essentially transparent to the radiant energy.

5. An apparatus for supplying radiant energy over a sample having a reaction surface, the sample absorbing at least a component of the radiant energy, and characterized by a nonuniform distribution of that loss, the apparatus comprising:
   a reaction chamber;
   means, mounted with the reaction chamber, for supporting the sample within the reaction chamber;
   means, mounted with the reaction chamber, or supporting the sample within the reaction chamber;
   means, mounted with the reaction chamber, or generating radiant energy; and
   energy distribution means, mounted with the means for generating, for distributing the radiant energy generated by the means or generating to from a controlled distribution of radiant energy at the reaction surface, and wherein the controlled distribution of radiant energy offsets the nonuniform distribution of heat loss of the sample;

wherein the means for generating radiant energy includes a plurality of lamps; and the energy distribution means comprises:

a lamp housing having a lamp seat for each of the plurality of lamps, each lamp seat having a reflective surface and the reflective surface of at least one lamp seat has a first portion with a first tilt with respect to a plane parallel to the reaction surface, and a second portion with a second tilt with respect to the plane parallel to the reaction surface.

6. The apparatus of claim 5, wherein the means for supporting includes:

a support member within the reaction chamber supporting the sample so that the reaction surface faces the energy distribution means; and means, coupled to the support member, for rotating the support member about an axis perpendicular to the reaction surface.

7. The apparatus f claim 6, wherein the plurality of lamps includes liner lamps.

8. The apparatus of claim 5, wherein the reflective surfaces of the lamp seats have conical curvatures.

9. The apparatus of claim 7, wherein he reflective surfaces of the lamp seats have conical curvatures.

10. The apparatus of claim 1, further including:

means, coupled to the reaction chamber, for sensing a temperature of the reaction surface.

11. The apparatus of claim 1, further including:

means, coupled of the means for generating, for controlling intensity of the radiant energy.

12. The apparatus of claim 5, further including:

means, coupled to the plurality of lamps, or individually controlling intensity of each of the plurality of lamps.

13. An apparatus for supplying radiant energy over a sample having a reaction surface, the sample absorbing at least a component of the radiant energy, and characterized by a nonuniform distribution of hat loss, the apparatus comprising:

a reacting chamber;

means, mounted with the reaction chamber, for supporting the sample within the reaction chamber;

means, mounted with the reaction chamber, for generating radiant energy; and energy distribution means, mounted with the means for generating, for distributing the radiant energy generated by the means for generating to form a controlled distribution of radiant energy at the reaction surface, and wherein the controlled distribution of radiant energy offsets the nonuniform distribution of heat loss of the sample;

wherein the reaction chamber includes a window on the reaction chamber through which the radiant energy enters the reaction chamber and wherein the window consists of a material that is essentially transparent to radiant energy in a first range absorbed by the sample, and that absorbs a long infrared range of radiation generated by the means for generating radiant energy, and has a thickness sufficient to filter the long infrared range of radiation so that the long infrared range does no the at inside the reaction chamber.

14. An apparatus for supplying a flow of a gas reactant over a reaction surface on a sample, the sample absorbing radiant energy within a given range of wavelengths, comprising:

a reaction chamber having a window essentially transparent to radiant energy in the given range;

means, mounted with the fraction chamber, for supporting the sample within the reaction chamber, so that the reaction surface on the sample faces the window;

means, in gas flow communication with the reaction chamber, for supplying a flow of reactant gas to the chamber between the window and the reaction surface;

pump means, having an exhaust port in gas flow communication with the reaction chamber, for pumping gas out of the reaction chamber to maintain a reduced pressure within the reaction chamber; and a reactant distribution means, mounted int eh reaction chamber between the reaction surface and the means for supplying reactant gas, and essentially transparent to radiant energy in the given range, for directing a distributed flow of reactant gas essentially perpendicular to the reaction surface.

15. The apparatus of claim 14, wherein the reactant distribution means, reaction surface and exhaust port define an essentially radially symmetric gas flow path over the reaction surface through the reaction chamber.

16. The apparatus of claim 15, wherein the reaction surface is between the reactant distribution means and the exhaust port.

17. The apparatus of claim 14, wherein the reactant distribution means includes:

a plate, mounted between the window and the reaction surface forming receiving compartment of the reactant gas, the plate essentially transparent to the given range of radiant energy and having a plurality of perforations providing distributed gas flow communication between the receiving compartment and the reaction surface.

18. The apparatus of claim 17, wherein the means for supplying a flow of reactant gas includes:

a plurality of gas ports connected to supply reactant gas, in gas flow communication with the receiving compartment.

19. An apparatus for supplying a flow of a gas reactant over a reaction surface on a sample, the sample absorbing radiant energy within a given range of wavelengths, comprising:

a reaction chamber having a window essentially transparent to radiant energy in the given range;

means, mounted with the reaction chamber, for supporting the sample within the reaction chamber, so that the reaction surface on the sample faces the window;

means, in gas flow communication with the reacting chamber, for supplying a flow of reactant gas to the chamber between the window and the reaction surface; and a reactant distribution means, mounted in the reaction chamber between the reaction surface and the means for supplying reactant gas, and essentially transparent to radiant energy in the given range, for directing a distributed flow of reactant gas essentially perpendicular to the reaction surface;

wherein the means for supporting includes:

a support member within the reaction chamber supporting the sample so that the reaction surface faces the reactant distribution means; and means, coupled to the support member, for rotating the support member about an axis perpendicular to the reaction surface.

20. The apparatus of claim 17, wherein the means for supporting includes:

a support member within the reaction chamber supporting the sample so that the reaction surface faces the reactant distribution means; and means, coupled to the support member, of rotating the support member about an axis perpendicular to the reaction surface.

21. The apparatus of claim 14, wherein the means for supporting includes a support member within the reaction chamber contact the sample, and the support member is mounted within a shadow of the sample so that the support member does not deflect the flow of reactant gas onto the reaction surface.

22. The apparatus of claim 14, wherein the means for supporting includes a support member within the reaction chamber with three sample contact points defining a support plane and contacting the ample.

23. An apparatus for supplying a flow of a gas reactant over a reaction surface on a sample, the sample absorbing radiation energy within a given range of wavelengths, comprising:

a reaction chamber having a wall and a window essentially transparent to radiant energy in the given range;

means of cooling the wall of the reaction chamber;

means, mounted with the reaction chamber, for supporting the sample within the reaction chamber, so that the reaction surface on the sample faces the window, and including a thermally inert support member contacting the sample;

means, in gas flow communication with the reaction chamber, for supplying a flow of reactant gas to the chamber between the window and the reaction surface; and a reactant distribution means, mounted in the fraction chamber between the reaction surface and the mans for supplying reactant gas, and essentially transparent to radiant energy in the given range, for directing a distributed flow of reactant gas essentially perpendicular to the reaction surface.

24. The apparatus of claim 23, wherein the window consists of a material that absorbs a long infrared range of radiation, and has a thickness sufficient to filter the long infrared range of radiation so that the long infrared range does not heat inside the reaction chamber.

25. An apparatus for inducing a controlled reaction on a reaction surface on a sample, the sample absorbing radiant energy within a given range of wavelengths, and characterized by a nonuniform distribution of heat loss, the apparatus comprising:

a reaction chamber having a wall and a window essentially transparent to radiant energy in the given range;

means, coupled with the reaction chamber, for cooling the wall of the reaction chamber;

support means, mounted with the reaction chamber, for supporting the sample within the reaction chamber, so that the reaction surface faces the window, and including a thermally inert support member contacting the sample;

means, mounted with the fraction chamber outside the window, for generating radiant energy in the given range;

energy distribution means, mounted with the means for generating, for distributing the radiant energy in the given range to form a controlled distribution of radiant energy at the reaction surface of the sample, and wherein the controlled distribution of radiant energy offsets the nonuniform distribution of heat loss on the sample;

means, in gas flow communication with the reaction chamber, for supplying a flow of reactant gas to the chamber between the window and the sample; and a reactant distribution means, mounted in the reaction chamber between the reaction surface on the sample and the means for supplying reactant gas, and transparent to radiant energy in the given range, for distributing the flow of reactant gas to create a distributed flow over the reaction surface on the sample.

26. The apparatus of claim 25, further including:

exhaust means, having an exhaust port in gas flow communication with the reaction chamber, for pumping gas out of the reaction chamber to maintain a reduced pressure within the reaction chamber.

27. The apparatus of claim 25, wherein the window consists of a material that absorbs a long infrared range of radiation generated by the means for generating radiant energy, and has a thickness sufficient to filter the long infrared range of radiation so that the long infrared range does not heat inside the reaction chamber.

28. The apparatus of claim 26, wherein the reactant distribution means, reaction surface and exhaust port define a gas flow path essentially perpendicular to the reaction surface and essentially radially symmetric through the reaction chamber.

29. The apparatus of claim 28, wherein the reaction surface is between the reactant distribution means and the exhaust port.

30. The apparatus of claim 25, wherein the reactant distribution means includes:

a plate, mounted between the window and the reaction surface forming receiving compartment for the reactant gas, the plate essentially transparent to the given range of radiant energy and having a plurality of perforations providing distributed gas flow communication between the receiving compartment and the reaction chamber.

31. The apparatus of claim 30, wherein the means for supplying a flow of reactant gas includes:

a plurality of gas ports connected to supply reactant gas, in gas flow communication with the receiving compartment.

32. The apparatus of claim 25, wherein the support member supports the sample so that the reaction surface faces the reactant distribution means; and the support means further includes:

means, coupled to the support member, for rotating the support member bout an axis a perpendicular to the reaction surface.

33. The apparatus of claim 30, wherein the support member supports the sample so that the reaction surface faces the reactant distribution means; and the support means further includes:

means, coupled to the support member, for rotating the support member about an axis perpendicular to the reaction surface.

34. The apparatus of claim 25, wherein the support member is mounted within a shadow of the sample so that the radiant energy does not directly strike the support member.

35. The apparatus of claim 25, wherein the support member includes three sample contact pointed defining a support plane and contacting the sample.

36. The apparatus of claim 25, wherein the support member consists of a material essentially transparent to the radiant energy.

37. The apparatus of claim 25, wherein the means for generating radiant energy includes a plurality of lamps; and the energy distribution means comprises:
   a lamp housing having a lamp seat for each of the plurality of lamps, each lamp seat having a reflective surface with an individually specified curvature, tilt and position with respect to a plane parallel to the reaction surface.

38. The apparatus of claim 32, wherein the means for generating radiant energy includes a plurality of line a lamps; and the energy distribution means comprises:
   a lamp housing having a plurality of lamp seats, one lamp seat for each of the plurality of linear lamps, each lamp seat having a reflective surface with an individually specified curvature, tilt and position with respect to a lane parallel to the reaction surface.

39. The apparatus of claim 38, wherein the reflective surfaces of the lamp seats have conical curvatures.

40. The apparatus of claim 38, wherein the reflective surfaces of the lamp seats have a first portion with a first tilt with respect to the plane parallel to the reaction surface, and a second portion with a second tilt with respect to the plane parallel to the reaction surface, and wherein the average of the first tilt and the second tilt equals the individually specified tilt for the reflective surface.

41. The apparatus of claim 39, wherein the reflective surfaces of the lamp seats have a first portion with a first tilt with respect to the plane parallel to the reaction surface, and a second portion with a second tilt with respect to the plane parallel to the reaction surface, and wherein the average of the first tilt and the second tilt equals the individually specified tilt for the reflective surface.

42. The apparatus of claim 25, further including:
   means, coupled to the reaction chamber, for sensing a temperature of the reaction surface.

43. The apparatus of claim 25, further including:
   means, coupled to the means for generating, for controlling intensity of the radiant energy.

44. The apparatus of claim 37, further including:
   means, coupled to each of the plurality of lamps, for individually controlling intensity of each of the plurality of lamps.

45. An apparatus for growing an epitaxial layer on a sample having a reaction surface, the sample absorbing heat causing energy; the apparatus comprising:
   a reaction chamber having a wall;
   means, coupled wit the reaction chamber, for cooling the wall of the reaction chamber;
   support means, mounted within the reaction chamber, for supporting the sample within the reaction chamber, and including a thermally inert support member contacting the sample;
   means mounted with the reaction chamber for generating heat causing energy and directing the heat causing energy on the reaction surface.

46. The apparatus of claim 45, wherein the heat causing energy is radiant energy, and the sup-port member comprises a material essentially transparent to the radiant energy.

47. The apparatus of claim 45, wherein the the support member is mounted within a shadow of the sample so that the heat causing energy does not directly strike the support member.

48. The apparatus of claim 45, wherein the support member includes three sample contact points defining a support plane and contacting the sample.

49. The apparatus of claim 46, wherein the reaction camber includes a window on the reaction chamber through which the radiant energy enters the reaction chamber, and wherein the window consists of a material that absorbs a long infrared range of radiation generated by the means for generating radiant energy, and has a thickness sufficient to filter the long infrared range of radiation so that the long infrared range does not heat inside the reaction chamber.

50. The apparatus of claim 45, wherein the support means includes:
   means, coupled to the support member, for rotating the support member about an axis perpendicular to the reaction surface.

51. The apparatus of claim 7, further including:
   means, coupled to the plurality of linear lamps, for individually controlling intensity of each of the plurality of linear lamps.

52. An apparatus of supplying a flow of a gas reactant over a reaction surface on a sample, the sample absorbing radiant energy within a given range of wavelengths, comprising:
   a reaction chamber having a window essentially transparent to radiant energy in the given range;
   means, counted with the reaction chamber, for supporting the sample within the reaction chamber, so that the reaction surface on the sample faces the window;
   means, in gas flow communication with the reaction chamber, for supplying a flow of reactant gas to the chamber between the window and the reaction surface;
   pump means, having an exhaust port in gas flow communication with the reaction chamber, for pumping gas out of the reaction chamber to maintain a reduced pressure within the reaction chamber; and
   a reactant distribution means, mounted in the reaction chamber between the reaction surface and the means for supplying reactant gas, and essentially transparent to radiant energy in the given range, for directing a distributed flow of reactant gas essentially perpendicular to the reaction surface;
   wherein the fraction surface is between the reactant distribution means and the exhaust port, and wherein the reactant distribution means, reaction surface and exhaust port provide for an essentially radially symmetric gas flow path over the reaction surface through the reaction chamber.

53. The apparatus of claim 52, wherein the reactant distribution means includes:
   a plate, mounted between the window and the reaction surface forming receiving compartment for the reactant gas, the plate essentially transparent to the given range of radian energy and having a plurality of perforations providing distributed gas flow communication between the receiving compartment and the reaction surface.

54. The apparats of claim 53, wherein the means for supplying a flow of reactant gas includes:
   a plurality of gas ports connected to supply reactant gas, in gas flow communication with the receiving compartment.

55. An apparatus for inducing a controlled reaction on a reaction surface on a sample, the sample absorbing radiant energy within a given range of wavelengths, and characterized by a nonuniform distribution of that loss, the apparatus comprising:

a reaction chamber having a wall and a window essentially transparent to radiant energy in the given range;

means, coupled with the reaction chamber, for cooling the wall of the reaction chamber;

support means, mounted with the reaction chamber, for supporting the sample within the reaction chamber, so that the reaction surface faces the window, the support means including a support member within the reaction chamber supporting the sample, and means, coupled of the support member, for rotating the support member about an axis perpendicular to the reaction surface;

means, mounted with the reaction chamber outside the window, for generating radiant energy in the given range;

energy distribution means, mounted with the means for generating, for distribution the radiant energy in the given range to form a controlled distribution having essentially rectangular symmetry of radiant energy at the reaction surface of the sample, and wherein the controlled distribution of radiant energy offsets the nonuniform distribution of that loss while the sample is rotated;

means, in gas flow communication with the reaction chamber, for supplying a flow of reactant gas to the chamber between the window and the sample; and a reactant distribution means, mounted in the reaction chamber between the reaction surface of the sample and the means for supplying reactant gas, and transparent to radiant energy in the given range, for directing the flow of reactant gas to create a distributed flow essentially perpendicular of the reaction surface on the sample.

* * * * *

UNITED STATES PATENT AND TRADEMARK OFFICE
CERTIFICATE OF CORRECTION

PATENT NO. : 5,156,820

DATED : October 20, 1992

INVENTOR(S) : Wong et al.

It is certified that error appears in the above-indentified patent and that said Letters Patent is hereby corrected as shown below:

Column 14, line 24, replace "or" with --for--.
Column 14, line 33, replace "distribution" with --distributing--.
Column 14, lines 36-37, replace "destruction" with --distribution--.
Column 14, line 53, replace "that" with --heat--.
Column 14, lines 58-59, delete "means, mounted with the reaction chamber, or supporting the sample within the reaction chamber;".
Column 15, line 20, replace "liner" with --linear--.
Column 15, line 32, replace "or" with --for--.
Column 15, line 38, replace "hat" with --heat--.
Column 15, line 40, replace "reacting" with --reaction--.
Column 15, line 51, replace "of" with --on--.
Column 15, line 61, replace "no the at" with --not heat--.
Column 16, line 1, replace "fraction" with --reaction--.
Column 16, line 13, replace "int eh" with --in the--.
Column 16, line 29, replace "of" with --for--.
Column 16, line 50, replace "reacting" with --reaction--.
Column 17, line 9, replace "contact" with --contacting--.
Column 17, line 16, replace "ample" with --sample--.
Column 17, line 35, replace "fraction" with --reaction--.
Column 17, line 37, replace "mans" with --means--.
Column 17, line 61, replace "fraction" with --reaction--.
Column 18, line 53, replace "bout" with --about--.
Column 18, line 67, replace "pointed" with --points--.
In column 19, line 13, replace "line a" with --linear--.
In column 19, line 19, replace "lane" with --plane--.
In column 19, line 54, replace "wit" with --with--.
In column 19, line 64, replace "sup-port" with --support--.
In column 19, line 67, delete the first "the".
In column 20, line 31, replace "counted" with --mounted--.
In column 20, line 49, replace "fraction" with --reaction--.

UNITED STATES PATENT AND TRADEMARK OFFICE
CERTIFICATE OF CORRECTION

PATENT NO. : 5,156,820

DATED : October 20, 1992

INVENTOR(S) : Wong et al.

It is certified that error appears in the above-indentified patent and that said Letters Patent is hereby corrected as shown below:

In column 20, line 60, replace "radian" with --radiant--.
In column 20, line 64, replace "apparats" with --apparatus--.
In column 21, line 5, replace "that" with --heat--.
In column 22, line 5, replace "distribution" with --distributing--.

In column 22, line 10, replace "that" with --heat--.
In column 22, line 20, replace "of" with --to--.

Signed and Sealed this

Fourteenth Day of July, 1998

Attest:

Attesting Officer

BRUCE LEHMAN

*Commissioner of Patents and Trademarks*